US011543710B2

(12) United States Patent
Hu (10) Patent No.: US 11,543,710 B2
(45) Date of Patent: Jan. 3, 2023

(54) DISPLAY PANEL WITH AN ANGLED SIGNAL LINE PENETRATING THROUGH STAGGERED NOTCHES OF CONDUCTING WIRES TO BE CONNECTED TO A DISLPAY REGION AND DISPLAY APPARATUS

(71) Applicant: HKC CORPORATION LIMITED, Shenzhen (CN)

(72) Inventor: Yunqin Hu, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 195 days.

(21) Appl. No.: 17/042,115

(22) PCT Filed: Dec. 4, 2018

(86) PCT No.: PCT/CN2018/119065
§ 371 (c)(1),
(2) Date: Sep. 26, 2020

(87) PCT Pub. No.: WO2020/093498
PCT Pub. Date: May 14, 2020

(65) Prior Publication Data
US 2021/0018787 A1    Jan. 21, 2021

(30) Foreign Application Priority Data
Nov. 5, 2018    (CN) .......................... 201811307829.0

(51) Int. Cl.
*G02F 1/1345*    (2006.01)
*G02F 1/1337*    (2006.01)
(Continued)

(52) U.S. Cl.
CPC ........ *G02F 1/13452* (2013.01); *G02F 1/0107* (2013.01); *G02F 1/1337* (2013.01);
(Continued)

(58) Field of Classification Search
CPC combination set(s) only.
See application file for complete search history.

(56) References Cited

U.S. PATENT DOCUMENTS

2006/0001789 A1\*  1/2006  Ahn ..................... G02F 1/1345
                                                            349/42
2006/0022201 A1\*  2/2006  Kim ..................... G02F 1/1339
                                                            438/151

FOREIGN PATENT DOCUMENTS

CN    106125411 A    11/2016
CN    106597723 A    4/2017
(Continued)

OTHER PUBLICATIONS

Jian Xu, the ISA written comments, Aug. 2019, CN.
Jian Xu, the International Search Report, dated Aug. 2019, CN.

*Primary Examiner* — Lauren Nguyen (57) ABSTRACT

Disclosed are a display panel and display apparatus. The display panel is divided into a display region and a peripheral region. The display panel includes: a first substrate; a second substrate arranged opposite to the first substrate; an alignment layer at least formed in the display region; and a sealing layer connecting the first substrate to the second substrate. The display panel is provided with a conducting wire group including at least one conducting wire, and the conducting wire includes a notch. The display panel includes at least one signal line. The signal line penetrates through the notch in the conducting wire to be connected to the display region. The signal line includes a first line segment and a second line segment communicated with each other. An included angle is formed between the second line segment and the first line segment which are bent relative to each other.

17 Claims, 7 Drawing Sheets

(51) Int. Cl.
*G02F 1/1339* (2006.01)
*H01L 27/12* (2006.01)
*G02F 1/161* (2006.01)
*G02F 1/1679* (2019.01)
*G02F 1/01* (2006.01)

(52) U.S. Cl.
CPC ............ *G02F 1/1339* (2013.01); *G02F 1/161* (2013.01); *G02F 1/1679* (2019.01); *H01L 27/124* (2013.01)

(56) References Cited

FOREIGN PATENT DOCUMENTS

| | | |
|---|---|---|
| CN | 206601549 U | 10/2017 |
| CN | 107329313 A | 11/2017 |
| CN | 107765484 A | 3/2018 |
| CN | 107884994 A | 4/2018 |
| JP | 2000258784 A | 9/2000 |

* cited by examiner

900 Display apparatus

100 Display panel

FIG. 10

DISPLAY PANEL WITH AN ANGLED SIGNAL LINE PENETRATING THROUGH STAGGERED NOTCHES OF CONDUCTING WIRES TO BE CONNECTED TO A DISLPAY REGION AND DISPLAY APPARATUS

CROSS REFERENCE OF RELATED APPLICATIONS

This application claims the priority to the Chinese Patent Application No. CN201811307829.0, filed with National Intellectual Property Administration, PRC on Nov. 5, 2018 and entitled "DISPLAY PANEL AND DISPLAY APPARATUS", which is incorporated herein by reference in its entirety.

TECHNICAL FIELD

This application relates to the field of display technologies, and in particular, to a display panel and a display apparatus.

BACKGROUND

Statement herein merely provides background information related to this application and does not necessarily constitute the existing technology.

With development and advancement of science and technologies, due to hot spots such as thinness, power saving, and low radiation, Liquid Crystal Displays (LCDs) become mainstream products of displays and are widely applied. Most LCDs are backlight LCDs, which include an LCD panel and a backlight module. The working principle of the liquid crystal panel is: Liquid crystal molecules are placed between two parallel glass substrates, and a drive voltage is applied across the two glass substrates to control rotating directions of the liquid crystal molecules, so that light in the backlight module is refracted out to generate an image.

A Thin Film Transistor-Liquid Crystal Display (TFT-LCD) has performance such as low power consumption, good picture quality, and a relatively high production yield and therefore has currently gradually been dominant in the field of display. In addition, the thin film transistor-liquid crystal display includes a liquid crystal panel and a backlight module. The liquid crystal panel includes a Color Filter substrate (CF substrate), a Thin Film Transistor substrate (TFT substrate), and a mask, and transparent electrodes are provided on relative inner sides of the substrates. A layer of Liquid Crystal (LC) molecules is sandwiched between two substrates. In the display panel, poor contact of frame glue easily occurs, which affects the manufacturing process yield of the display panel.

SUMMARY

The objective of this application is to provide a display panel and a display apparatus, which can effectively prevent alignment liquid from overflowing and overlapping frame glue.

To achieve the foregoing objective, this application provides a display, including: a first substrate; a second substrate arranged opposite to the first substrate, where the first substrate and the second substrate are respectively provided with a display region and a peripheral region; an alignment layer arranged on the first substrate and the second substrate and at least formed in the display region; and a sealing layer formed in the peripheral region and connecting the first substrate to the second substrate, where the display panel is provided with a conducting wire group in the peripheral region and the display panel includes at least one signal line; the conducting wire group includes at least one conducting wire, the conducting wire includes a notch, the signal line sequentially penetrates through the corresponding notch in each conducting wire to be connected to the display region, the signal line includes a first line segment and a second line segment communicated with each other, and the portion, penetrating through the notch, of the signal line is the first line segment; the portion arranged outside the notch and corresponding to the position of the notch is the second line segment, and the second line segment is arranged on one side, close to or far away from the sealing layer, of the notch; and an included angle is formed between the second line segment and the first line segment which are bent relative to each other.

Optionally, the included angle formed between the second line segment and the first line segment which are bent relative to each other is 90 degrees.

Optionally, the conducting wire group includes a first conducting wire and a second conducting wire, the distances from the first conducting wire and the second conducting wire to the sealing layer are different, the first conducting wire is provided with a first notch, the second conducting wire is provided with a second notch, and the first notch and the second notch are staggered from each other, the signal line sequentially penetrates through the first notch and the second notch to be connected to the display region; the signal line includes at least two first line segments and one second line segment, and the portions penetrating through the first notch and the second notch are the first line segments; and the portion arranged between the first notch and the second notch is the second line segment.

Optionally, the conducting wire group further includes a third conducting wire, the distance from the first conducting wire to the sealing layer is a first distance, the distance from the second conducting wire to the sealing layer is a second distance, and the distance from the third conducting wire to the sealing layer is a third distance; every two of the first distance, the second distance and the third distance are different; the third conducting wire is separately provided with a third notch at a position corresponding to the signal line, and every two of the notches are staggered from each other; and in the extension direction of the conducting wire group, the first notch is located on one side of the second notch, and the third notch is located on the other side of the second notch.

Optionally, the conducting wire group further includes a third conducting wire, the distance from the third conducting wire to the sealing layer is different from the distances from the first conducting wire and the second conducting wire to the sealing layer; the third conducting wire is separately provided with a third notch at a position corresponding to the signal line, and every two of the notches are staggered from each other, and in the extension direction of the conducting wire group, the first notch and the third notch are located on the same side of the second notch.

Optionally, the conducting wire group further includes a fourth conducting wire or even more conducting wires, which are respectively provided with a notch; and in the extension direction of the conducting wire group, the notches extend along the same direction.

Optionally, the first notch and the third notch are located on the same straight line perpendicular to the extension direction of the conducting wire group.

Optionally, the conducting wire group further includes a fourth conducting wire or even more conducting wires, which are respectively provided with a notch; and in the extension direction of the conducting wire group, the notches extend along different directions.

Optionally, the conducting wire group further includes a fourth conducting wire, the fourth conducting wire is arranged between the first conducting wire and the second conducting wire, the fourth conducting wire is provided with a fourth notch, and the fourth notch and the first notch are located on the same straight line perpendicular to the extension direction of the conducting wire group.

Optionally, the signal line penetrates through the conducting wire group and the signal line is axially symmetric by taking the second conducting wire as an axis.

Optionally, the conducting wire group further includes a fourth conducting wire, the fourth conducting wire is arranged between the first conducting wire and the second conducting wire, the fourth conducting wire is provided with a fourth notch, and the fourth notch and the first notch are located on the same straight line perpendicular to the extension direction of the conducting wire group.

Optionally, the conducting wire group further includes a fourth conducting wire, the fourth conducting wire is provided with a notch, and in the extension direction of the conducting wire group, the notches extend along the same direction.

Optionally, the conducting wire group further includes a fourth conducting wire, the fourth conducting wire is provided with a notch, and in the extension direction of the conducting wire group, the notches extend along different directions.

Optionally, the wire width of the conducting wire is w and the width of the position of the conducting wire corresponding to the second line segment of the signal line is smaller than w.

Optionally, the display panel includes: a first metal layer, a second metal layer and an insulating layer formed between the first metal layer and the second metal layer; the conducting wire is electrically connected at the notch through an arranged jumper wire; the conducting wire is formed by the second metal layer; the jumper wire is formed by the first metal layer; and the jumper wire and the conducting wire are both provided with contact holes, and the jumper wire and the conducting wire are electrically connected through the contact holes.

Optionally, the signal line is formed by the second metal layer, and the conducting wire and the signal line are insulated from each other; the second metal layer is provided with a conductive layer insulated from the second metal layer; the conducting wire is separated into a first conducting wire segment and a second conducting wire segment by the notch; the contact hole includes a first transition hole and a second transition hole, and the first transition hole is arranged in the conducting wire and is located at one ends at which the first conducting wire segment and the second conducting wire segment are connected with each other; the second transition hole is arranged in the jumper wire; and the conductive layer electrically connects the first conducting wire segment and the second conducting wire segment with the jumper wire through the first transition hole and the second transition hole.

Optionally, the conductive layer is a transparent conductive film.

This application further provides another display panel, including: a first substrate; a second substrate arranged opposite to the first substrate, where the first substrate and the second substrate are respectively provided with a display region and a peripheral region; an alignment layer arranged on the first substrate and the second substrate and at least formed in the display region; and a sealing layer formed in the peripheral region and connecting the first substrate to the second substrate. The display panel is provided with a conducting wire group in the peripheral region and the display panel includes at least one signal line; the conducting wire group includes a first conducting wire, a second conducting wire and a third conducting wire, and the distances from the first conducting wire, the second conducting wire and the third conducting wire to the sealing layer are different; the first conducting wire is provided with a first notch, the second conducting wire is provided with a second notch, and the third conducting wire is provided with a third notch; in the extension direction of the conducting wire group, the first notch and the third notch are located on the same side of the second notch, and the first notch and the third notch are located on the same straight line perpendicular to the extension direction of the conducting wire group; the signal line sequentially penetrates through the first notch, the second notch and the third notch to be connected to the display region; the signal line includes first line segments and second line segments, the first line segments and the second line segments are communicated with each other, and the portions, penetrating through the first notch, the second notch and the third notch, of the signal line are the first line segments; the portions arranged outside the notches and corresponding to the positions of the notches are the second line segments, and the second line segments are arranged on one side close to or far away from the sealing layer, of the notches; and an included angle is formed between the second line segment and the first line segment which are bent relative to each other.

This application further provides a display apparatus, including a display panel, where the display panel includes: a first substrate; a second substrate arranged opposite to the first substrate, where the first substrate and the second substrate are respectively provided with a display region and a peripheral region; an alignment layer arranged on the first substrate and the second substrate and at least formed in the display region; and a sealing layer formed in the peripheral region and connecting the first substrate to the second substrate, where the display panel is provided with a conducting wire group in the peripheral region and the display panel includes at least one signal line;

the conducting wire group includes at least one conducting wire, the conducting wire includes a notch, the signal line sequentially penetrates through the corresponding notch in each conducting wire to be connected to the display region, the signal line includes a first line segment and a second line segment communicated with each other, and the portion, penetrating through the notch, of the signal line is the first line segment; the portion arranged outside the notch and corresponding to the position of the notch is the second line segment, and the second line segment is arranged on one side, close to or far away from the sealing layer, of the notch; and an included angle is formed between the second line segment and the first line segment which are bent relative to each other.

Optionally, the conducting wire group includes a first conducting wire, a second conducting wire and a third conducting wire, the distances from the first conducting wire, the second conducting wire and the third conducting wire to the sealing layer are different, the first conducting wire is provided with a first notch, the second conducting wire is provided with a second notch, the third conducting wire is separately provided with a third notch at a position corresponding the signal line, and every two of the notches are staggered from each other;

the signal line sequentially penetrates through the first notch and the second notch to be connected to the display region; the signal line includes at least two first line segments and one second line segment, and the portions penetrating through the first notch and the second notch are the first line segments; the portion arranged between the first notch and the second notch is the second line segment; the conducting wire group further includes a third conducting wire, and the distance from the third conducting wire to the sealing layer is different from the distances from the first conducting wire and the second conducting wire to the sealing layer; and in the extension direction of the conducting wire group, the first notch is located on one side of the second notch, and the third notch is located on the other side of the second notch.

The alignment layer in the display panel is formed by dropping the alignment liquid. Because the alignment liquid is droplet-like and has high fluidity, even if the conducting wire can obstruct the flow of the alignment liquid, when the signal line straightly penetrates through the notch in the conducting wire to be connected to the display region, the alignment liquid in the display region will flow into the peripheral region through the notch in the conducting wire along the signal line before the formation of the alignment layer. However, the alignment liquid flowing into the peripheral region will overlap the sealing layer, resulting in poor contact of the sealing layer, causing poor connection between the first substrate and the second substrate, and affecting the yield of the display panel. In this application, an included angle is formed between the first line segment and the second line segment of the signal line which are bent relative to each other. That is, the signal line is bent and the length of the signal line is prolonged, making the flow path of the alignment liquid flowing into the peripheral region through the notch in the conducting wire along the signal line be prolonged; the bending of the signal line plays a role of obstructing and buffering the flow of the alignment liquid into the peripheral region, and the situation of poor contact of the sealing layer caused by the alignment liquid overflowing and overlapping the sealing layer is effectively prevented from occurring; and thus the condition of connection between the first substrate and the second substrate is improved, and the manufacturing process yield of the display panel is improved.

BRIEF DESCRIPTION OF DRAWINGS

The included accompanying drawings are used to provide further understanding of the embodiments of this application, constitute a part of the specification, and are used to illustrate implementations of this application and explain the principle of this application together with literal descriptions. Apparently, the accompanying drawings in the following descriptions are merely some embodiments of this application, and a person of ordinary skill in the art can also obtain other accompanying drawings according to these accompanying drawings without involving any creative effort. In the accompanying drawings.

DETAILED DESCRIPTION OF EMBODIMENTS

Specific structures and functional details disclosed herein are merely representative, and are intended to describe the objectives of the exemplary embodiments of this application. However, this application may be specifically implemented in many alternative forms, and should not be construed as being limited to the embodiments set forth herein.

In the description of this application, it should be understood that orientation or position relationships indicated by the terms such as "center", "transverse", "on", "below", "left", "right", "vertical", "horizontal", "top", "bottom", "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of this application. In addition, the terms such as "first" and "second" are used only for the purpose of description, and should not be understood as indicating or implying the relative importance or implicitly specifying the number of the indicated technical features. Therefore, a feature defined by "first" or "second" can explicitly or implicitly includes one or more of said features. In the description of this application, unless otherwise stated, "a plurality of" means two or more than two. In addition, the terms "include", "comprise" and any variant thereof are intended to cover non-exclusive inclusion.

In the description of this application, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. Persons of ordinary skill in the art may understand the specific meanings of the foregoing terms in this application according to specific situations.

The terminology used herein is for the purpose of describing specific embodiments only and is not intended to be limiting of exemplary embodiments. As used herein, the singular forms "a", "an" and "the" are intended to include the plural forms as well, unless the context clearly indicates otherwise. It should be further understood that the terms "include" and/or "comprise" when used in this specification, specify the presence of stated features, integers, steps, operations, elements, and/or components, but do not preclude the presence or addition of one or more other features, integers, steps, operations, elements, components, and/or combinations thereof.

Figure 1:
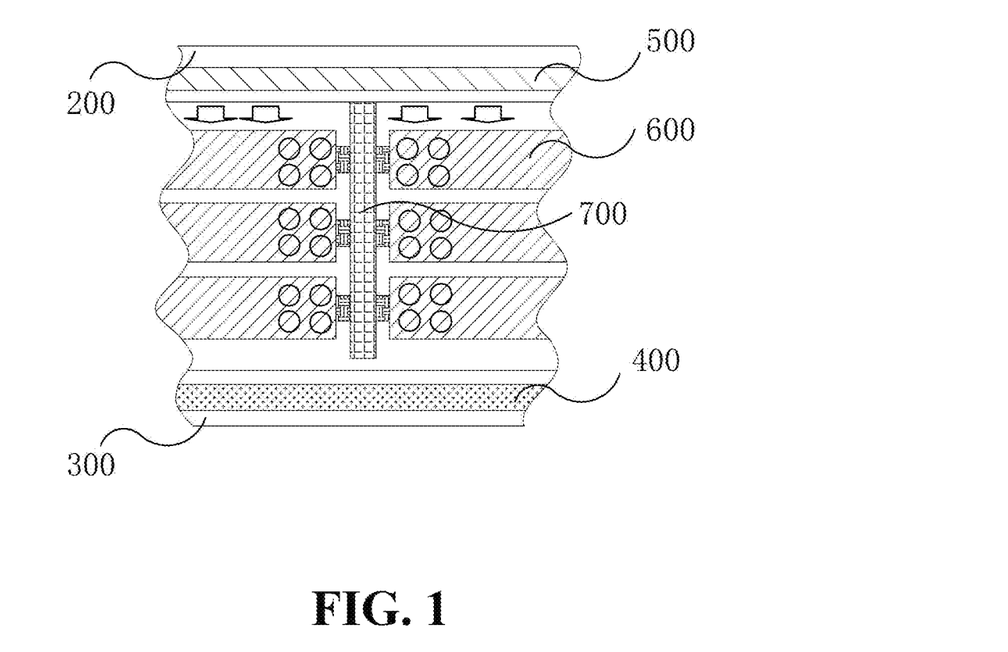
FIG. 1 is a structural schematic diagram of a display panel according to an embodiment of this application.
Figure 2:
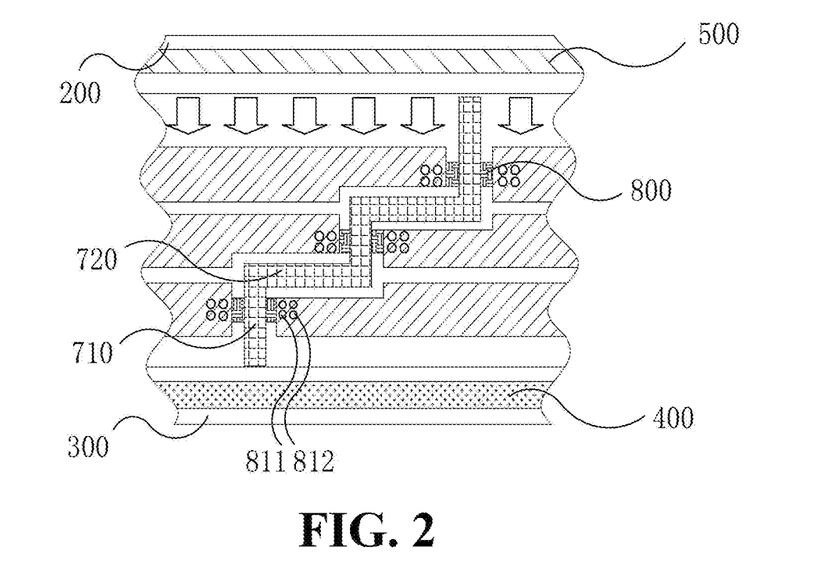
FIG. 2 is a structural schematic diagram of another display panel according to an embodiment of this application.
Figure 3:
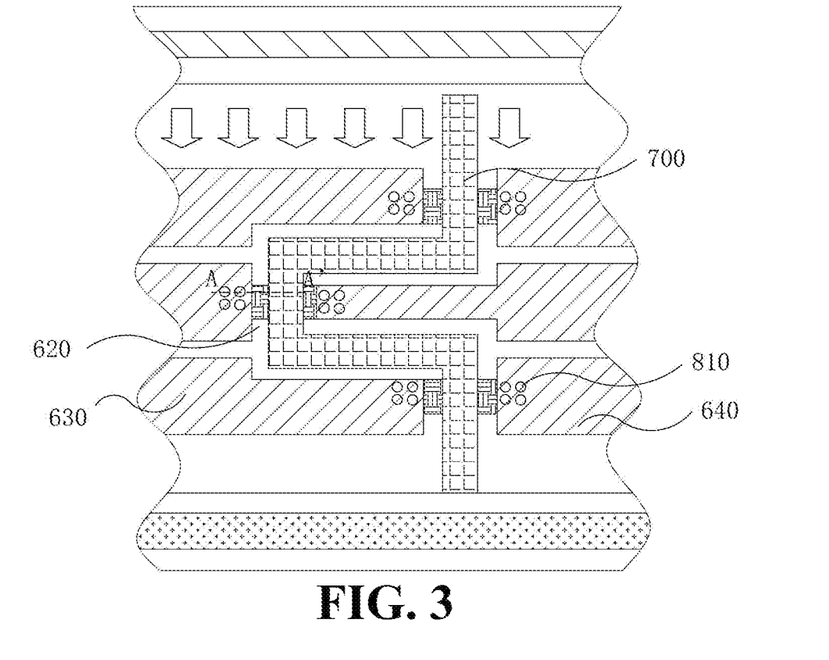
FIG. 3 is a schematic diagram of another display panel according to an embodiment of this application.

A display panel is often designed with a signal line jumping a conducting wire and connected to a display region. A notch illustrated in FIG. 1 is formed at a jumping position, and alignment liquid will overflow along the notch.

This application is further described below with reference to the accompanying drawings and optional embodiments.

Referring to FIGS. 1 to 8, the embodiment of this application discloses a display panel 100, including: a first substrate 110; a second substrate 120 arranged opposite to the first substrate 110, where the first substrate 110 and the first substrate 120 are respectively provided with a display region 200 and a peripheral region 300; an alignment layer 500 arranged on the first substrate 110 and the first substrate 120 and at least formed in the display region 200; and a sealing layer 400 formed in the peripheral region 300 and connecting the first substrate 110 to the first substrate 120, where the display panel is provided with a conducting wire group 600 in the peripheral region 300 and the display panel includes at least one signal line 700; the conducting wire group 600 includes at least one conducting wire 610, the conducting wire 610 includes a notch 620, the signal line 700 sequentially penetrates through the corresponding notch 620 in each conducting wire 610 to be connected to the display region 200, the signal line 700 includes a first line segment 710 and a second line segment 720 communicated with each other, and the portion, penetrating through the notch 620, of the signal line 700 is the first line segment 710; the portion arranged outside the notch 620 and corresponding to the position of the notch 620 is the second line segment 720, and the second line segment 720 is arranged on one side, close to or far away from the sealing layer 400, of the notch 620; and an included angle is formed between the second line segment 720 and the first line segment 710 which are bent relative to each other. In this solution, 180 degrees is not considered as an angle, the default optimum angle is 90 degrees, but an angle may also be selected according to the actual situation.

The alignment layer 500 in the display panel 100 is formed by dropping alignment liquid. Because the alignment liquid is droplet-like and has high fluidity, even if the conducting wire 610 can obstruct the flow of the alignment liquid, when the signal line 700 straightly penetrates through the notch 620 in the conducting wire 610 to be connected to the display region 200, the alignment liquid in the display region 200 will flow into the peripheral region 300 through the notch 620 in the conducting wire 610 along the signal line 700 before the formation of the alignment layer 500. However, the alignment liquid flowing into the peripheral region 300 will overlap the sealing layer 400, resulting in poor contact of the sealing layer 400, causing poor connection between the first substrate 110 and the second substrate 120, and affecting the yield of the display panel 100. In this application, an included angle is formed between the first line segment 710 and the second line segment 720 of the signal line 700 which are bent relative to each other. That is, the signal line 700 is bent and the length of the signal line 700 is prolonged, making the flow path of the alignment liquid flowing into the peripheral region through the notch 620 in the conducting wire 610 along the signal line 700 be prolonged; the bending of the signal line 700 plays a role of obstructing and buffering the flow of the alignment liquid into the peripheral region 300, and the situation of poor contact of the sealing layer caused by the alignment liquid overflowing and overlapping the sealing layer is effectively prevented from occurring; and thus the condition of connection between the first substrate 110 and the second substrate 120 is improved, and the manufacturing process yield of the display panel 100 is improved.

In one or more embodiments, the conducting wire group 600 includes a first conducting wire 611 and a second conducting wire 612, the distances from the first conducting wire 611 and the second conducting wire 612 to the sealing layer 400 are different, the first conducting wire 611 is provided with a first notch 621, the second conducting wire 612 is provided with a second notch 622, and the first notch 621 and the second notch 622 are staggered from each other, the signal line 700 sequentially penetrates through the first notch 621 and the second notch 622 to be connected to the display region 200; the signal line 700 includes at least two first line segments 710 and one second line segment 720, and the portions penetrating through the first notch 621 and the second notch 622 are the first line segments 710; and the portion arranged between the first notch 321 and the second notch 620 is the second line segment.

In this solution, the first notch 621 and the second notch 622 are staggered from each other such that the signal line 700 penetrating through the conducting wire 610 is bent and the length of the signal line 700 penetrating the conducting wire 610 is prolonged; the portions, penetrating through the first notch 621 and the second notch 622, of the signal line 700 are the first line segments 710, the portion between the first notch 621 and the second notch 622 is the second line segment 720, so the first line segment 710 and the second line. Section 720 form an included angle between the first notch 621 and the second notch 622. That is, the signal line 700 is bent between the first conducting wire 611 and the second conducting wire 612, the first conducting wire 611 and the second conducting wire 612 play a role of obstructing the alignment liquid, when the alignment fluid flows through the notch 620 to a position between the first conducting wire 611 and the second conducting wire 612, the signal line 700 between the first conducting wire 611 and the second conducting wire 612 plays a role of obstructing and buffering the flow of the alignment liquid, the flow path of the alignment liquid flowing along the signal line 700 into peripheral region 300 is prolonged, the situation of poor contact of the sealing layer caused by the alignment liquid overflowing and overlapping the sealing layer 400 can be effectively avoided, and the manufacturing process yield of the display panel 100 is improved.

In one or more embodiments, the conducting wire group 600 further includes a third conducting wire 613, the distance from the third conducting wire 613 to the sealing layer 400 is different from the distances from the first conducting wire 611 and the second conducting wire 612 to the sealing layer 400; the third conducting wire 613 is separately provided with a third notch 623 at a position corresponding to the signal line 700, and every two of the notches 620 are staggered from each other; and in the extension direction of the conducting wire group 600, the first notch 621 is located on one side of the second notch 622, and the third notch 623 is located on the other side of the second notch 622.

In this solution, the conducting wire group 600 further includes a third conducting wire 613, which ensures the width of the conducting wire group 600 in the peripheral region 300, and provides more possibilities for the bending of the signal line 700 penetrating through the notch 620, such that the flow path of the alignment liquid flowing along the signal line 700 into the peripheral region 300 is further prolonged; in the extension direction of the conducting wire group 600, the first notch 621 is located on one side of the second notch 622, the third notch 623 is located on the other side of the second notch 622, and the signal line 700 penetrates through the first notch 621, the second notch 622 and the third notch 623 to be connected to the display region 200, such that, while prolonging the flow path of the alignment liquid, the signal line 700 also forms a regular direction in the conducting wire group 600, it is suitable for the conducting wire group 600 with a small width, the situation of poor contact between the sealing layer 400 and the first substrate 110 and the second substrate 120 caused by the alignment liquid overflowing and overlapping the sealing layer 400 can be effectively prevented from occurring, and the manufacturing process yield of the display panel 100 is improved.

In one or more embodiments, the conducting wire group 600 further includes a third conducting wire 613, the distance from the first conducting wire 611 to the sealing layer 400 is a first distance, the distance from the second conducting wire 612 to the sealing layer 400 is a second distance, and the distance from the third conducting wire 613 to the sealing layer 400 is a third distance; every two of the first distance, the second distance and the third distance are different; the third conducting wire 613 is separately provided with a third notch 623 at a position corresponding to the signal line 700, and every two of the notches 620 are staggered from each other; and in the extension direction of the conducting wire group 600, the first notch 621 and the third notch 623 are located on the same side of the second notch 622.

In this solution, the conducting wire group 600 further includes a third conducting wire 613, which ensures the width of the conducting wire group 600 in the peripheral region 300, and provides more possibilities for the bending of the signal line 700 penetrating through the notch 620, such that the flow path of the alignment liquid flowing along the signal line 700 into the peripheral region 300 is further prolonged; in the extension direction of the conducting wire group 600, the first notch 621 and the third notch 623 are located on the same side of the second notch 622, the signal line 700 penetrates through the first notch 621, the second notch 622 and the third notch 623 to be connected to the display region 200, and the alignment liquid flows along the direction of the signal line 700, such that the inertia of the flow of the alignment liquid along the signal line 700 in the conducting wire group 600 is weakened, it is suitable for the conducting wire group 600 with a larger width, the flow of the alignment liquid is slowed down while the flow path of the alignment liquid is prolonged, and the situation of poor contact of the sealing layer 400 caused by the alignment liquid overflowing and overlapping the sealing layer 400 can be effectively avoided; and the manufacturing process yield is improved.

Figure 4:
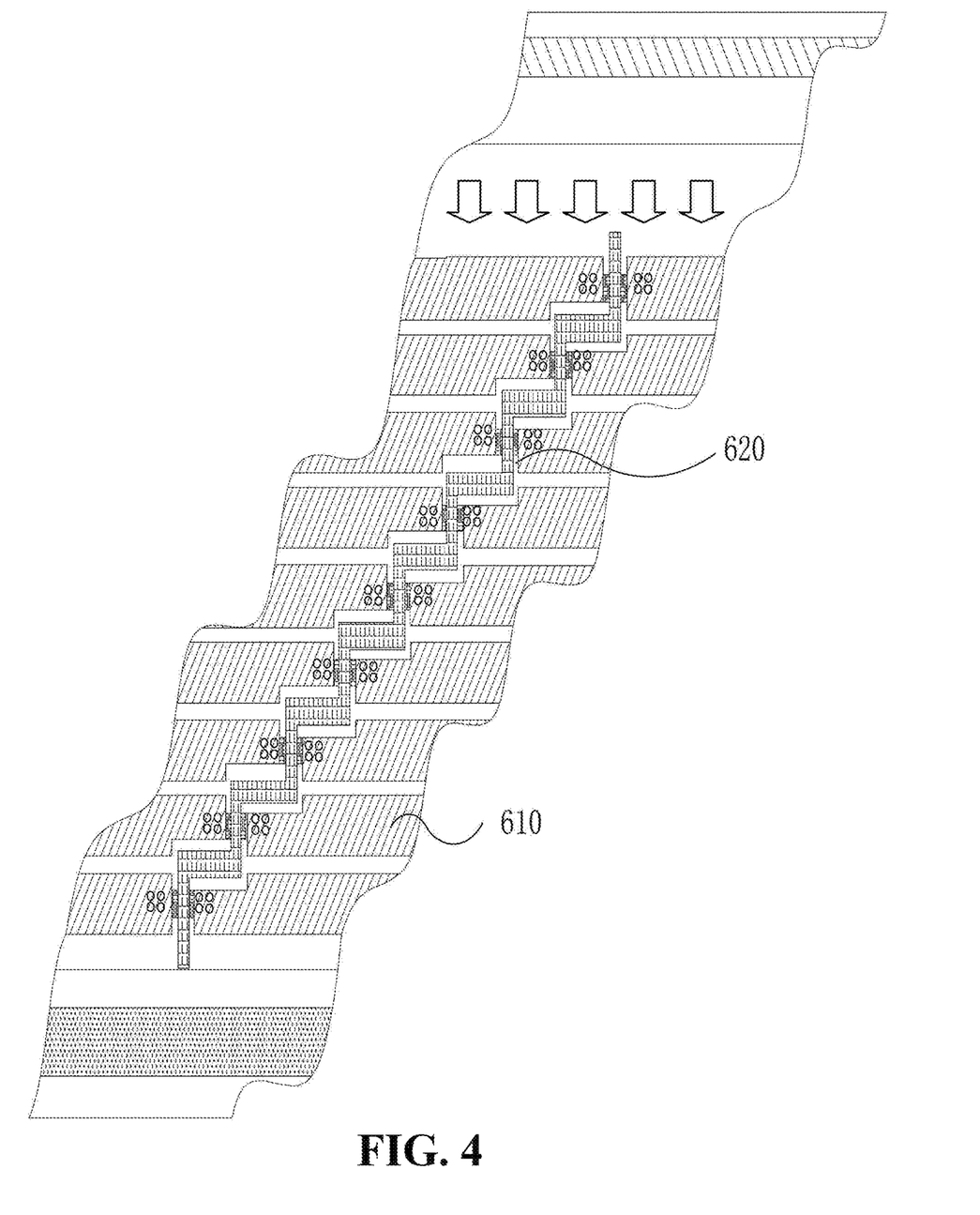
FIG. 4 is a schematic diagram of another display panel according to an embodiment of this application.

As illustrated in FIG. 4, in one or more embodiments, the conducting wire group 600 further includes a fourth conducting wire 614 or even more conducting wires, which are respectively provided with a notch 620; and in the extension direction of the conducting wire group 600, the notches 620 extend along the same direction.

In this solution, the notch 620 in the conducting wire 610 in the conducting wire group 600 extends along the same direction, and the signal line 700 sequentially penetrates through the notch 620 in the conducting wire to be connected to the display region, such that the flow path of the alignment liquid flowing along the signal line 700 into the peripheral region 300 is greatly prolonged, the situation of poor contact between the sealing layer 400 and the first substrate 110 and the second substrate 120 caused by the alignment liquid overflowing and overlapping with the sealing layer 400 is effectively prevented from occurring, and the manufacturing process yield of the display panel 100 is improved; and the signal line 700 sequentially penetrating through the notch 620 forms regular bending, and the manufacturing process of the display panel 100 is facilitated.

In one or more embodiments, the first notch 621 and the third notch 623 are located on the same straight line perpendicular to the extension direction of the conducting wire group 600. In this solution, the first notch 621 and the third notch 623 are located on the same straight line perpendicular to the extension direction of the conducting wire group 600, such that the arrangement of the signal line 700 of the conducting wire group 600 presents regular bending and presents an axially symmetric shape. By prolonging the flow path of the alignment liquid, the inertia of the alignment liquid flowing along the signal line 700 in the conducting wire group 600 can be weakened, the flow of the alignment liquid is slowed down, the situation of poor contact of the sealing layer 400 caused by the alignment liquid overflowing and overlapping the sealing layer 400 is effectively prevented from occurring, the manufacturing process yield is improved, it is ensured that the signal line 700 is located as far as possible in the middle of a rectangular area after the formation of a bend, thus facilitating the use of the mask when the mask is used for the manufacturing process, the mask is repetitively used to make the signal line 700 and the conducting wire group 600, and the manufacturing process of the display panel 100 is simplified.

Figure 5:
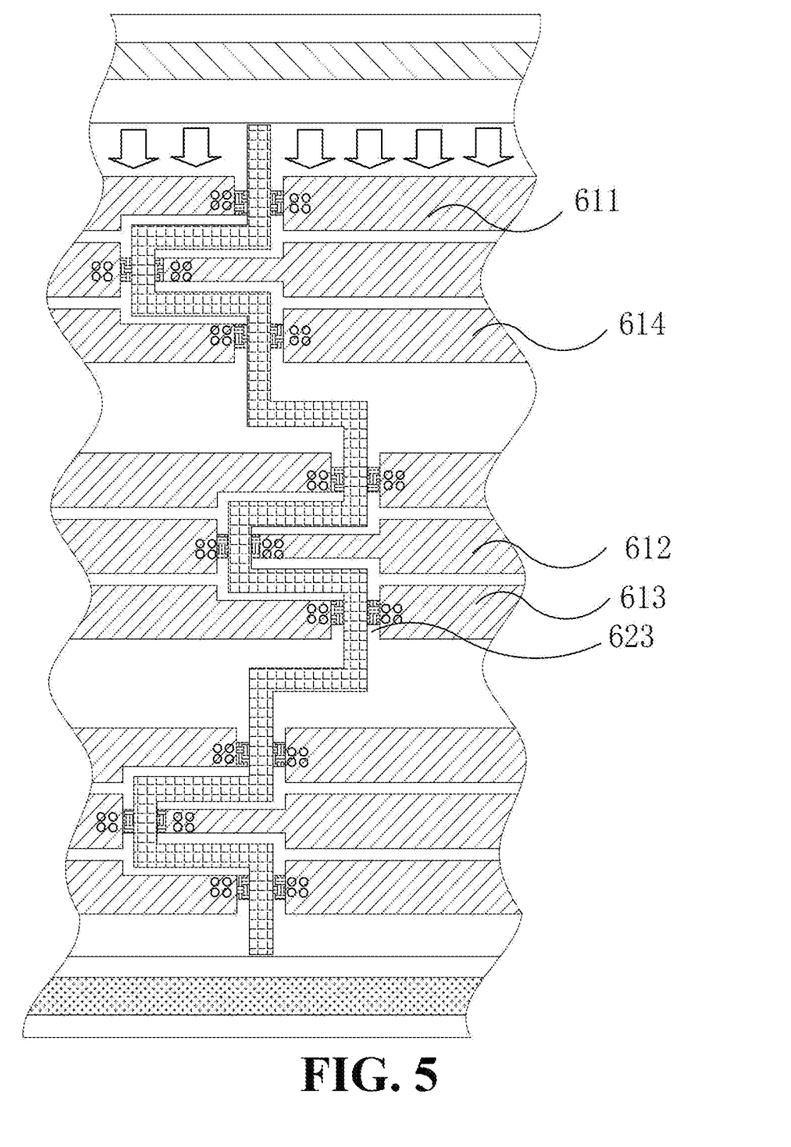
FIG. 5 is a schematic diagram of another display panel according to an embodiment of this application.

In one or more embodiments, the conducting wire group 600 further includes a fourth conducting wire 614 or even more conducting wires, which are respectively provided with a notch 620; and in the extension direction of the conducting wire group 600, the notches 620 extend along different directions, as illustrated in FIG. 5.

Figure 6:
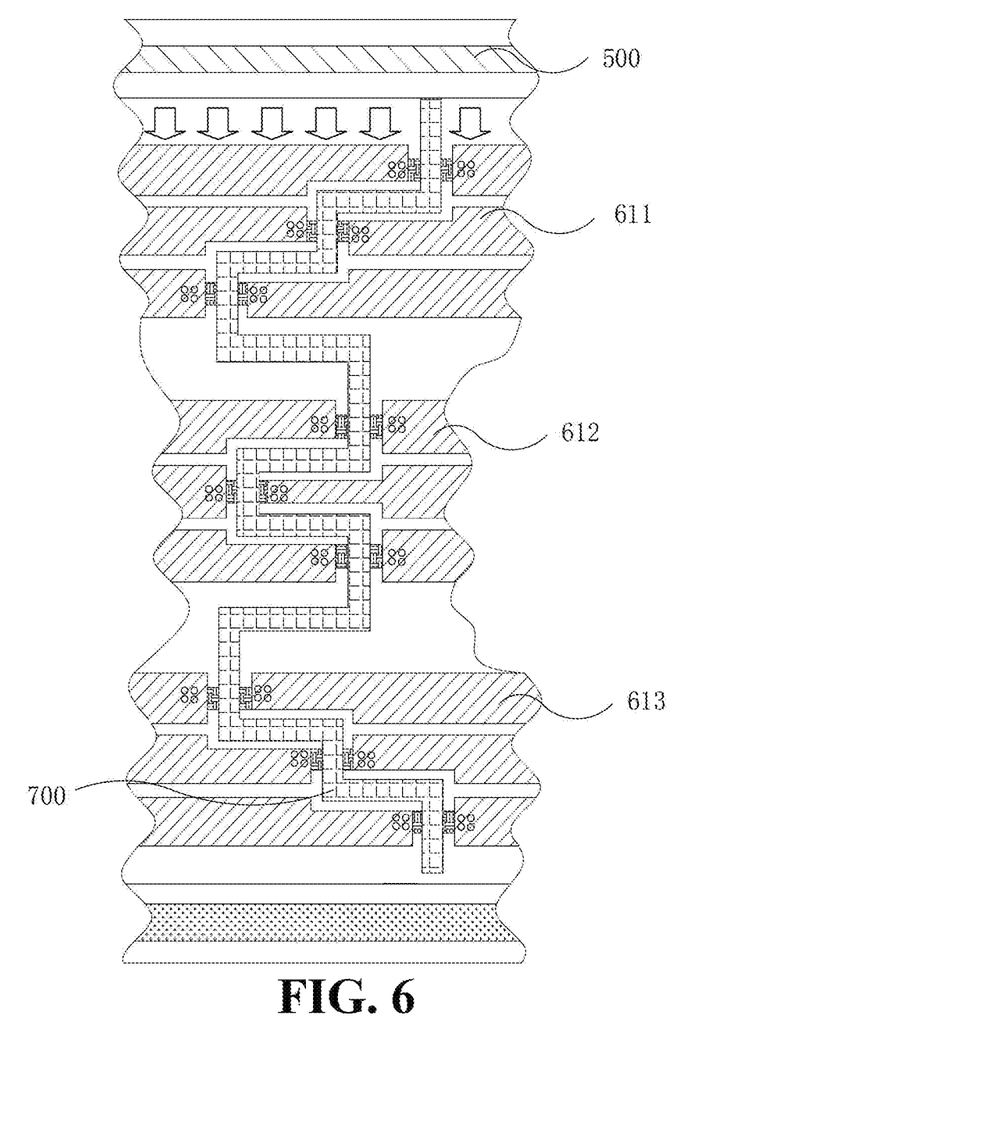
FIG. 6 is a schematic diagram of another display panel according to an embodiment of this application.

In this solution, the conducting wire group 600 further includes a fourth conducting wire 614 or even more conducting wires, which ensures the width of the conducting wire group 600 in the peripheral region 300, and provides more possibilities for the bending of the signal line 700 penetrating through the notches 620, such that the flow path of the alignment liquid flowing along the signal line 700 into the peripheral region 300 is further prolonged; in the extension direction of the conducting wire group 600, the notches 620 extend along different directions, the signal line 700 penetrates through the notches 620 and is bent, and the alignment liquid flows along the direction of the signal line 700, such that the inertia of the alignment liquid flowing along the signal line 700 in the conducting wire group 600 is weakened, it is suitable for the conducting wire group 600 with a larger width, the flow of the alignment liquid is slowed down while the flow path of the alignment liquid is prolonged, and the situation of poor contact of the sealing layer 400 caused by the alignment liquid overflowing and overlapping the sealing layer 400 can be effectively avoided; and the manufacturing process yield is improved. Of course, it can be designed that the notches 620 extend along the same direction or different directions according to the need, as illustrated in FIG. 6.

In this solution, in the extension direction of the conducting wire group 600, the notches 620 may extend along the same direction or different directions, or in several conducting wires 610, the notches 620 may extend along the same direction, and in other conducting wires 610, the notches 620 may extend along different directions; the different extension directions of the notches 620 bring different effects, the signal line 700 sequentially penetrates through the notches 620 to be connected to the display region 200, and under the situation that the notches 620 extend along the same direction, the direction of the signal line 700 is fixed; the flow of the alignment liquid has inertia, and under the situation that the notches 620 extend along different directions, the signal line 700 penetrating through the notches 620 plays a better role in obstructing the alignment liquid; and the extension directions of the notches 620 may be designed according to the requirement in the actual application process in order to obtain a better display panel 100 with better quality.

Figure 7:
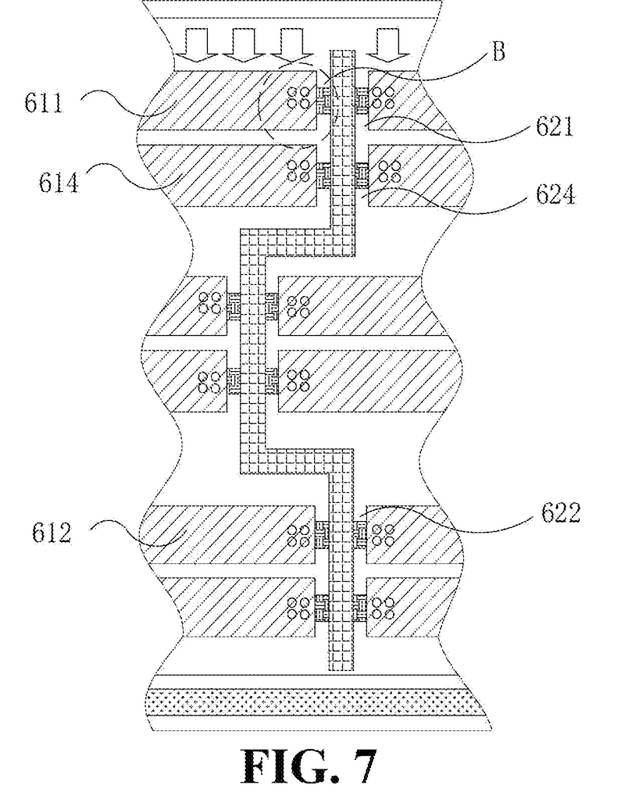
FIG. 7 is a schematic diagram of another display panel according to an embodiment of this application.

As illustrated in FIG. 7, in one or more embodiments, the conducting wire group 600 further includes a fourth conducting wire 614, the fourth conducting wire 614 is arranged between the first conducting wire 611 and the second conducting wire 612, the fourth conducting wire 614 is provided with a fourth notch 624, and the fourth notch 624 and the first notch 621 are located on the same straight line perpendicular to the extension direction of the conducting wire group 600.

In this solution, the fourth notch 624 and the first notch 621 are located on the same straight line perpendicular to the extension direction of the conducting wire group 600, and the fourth conducting wire 614 is located between the first conducting wire 611 and the second conducting wire 612. When the signal line 700 penetrates through the position between the fourth notch 624 in the fourth conducting wire 614 and the first notch 621, no bending is needed, the material of the signal line 700 is saved, the bending times of the signal line 700 are reduced, and by bending other positions, not only can the effect of obstructing the alignment liquid be realized, but also the signal line 700 can be fully saved.

In one or more embodiments, the wire width of the conducting wire 610 is w and the width of the position of the conducting wire 610 corresponding to the second line segment 720 of the signal line 700 is smaller than w. In this solution, the second line segment 720 and the first line segment 710 of the signal line 700 are bent relative to each other to form an included angle, and the width of the position of the conducting wire 610 corresponding to the second line segment 720 of the signal line 700 is smaller than w, such that the conducting wire 610 does not need to be bent for the bending of the signal line 700, and the direction and arrangement of the conducting wire 610 remain unchanged; the area occupied by the conducting wire 610 and the signal line 700 in the display panel 100 remains unchanged, the other parts of the display panel remain unchanged, and the other structures in the display panel 100 are not affected while the purpose of obstructing the alignment liquid is achieved.

Figure 8:
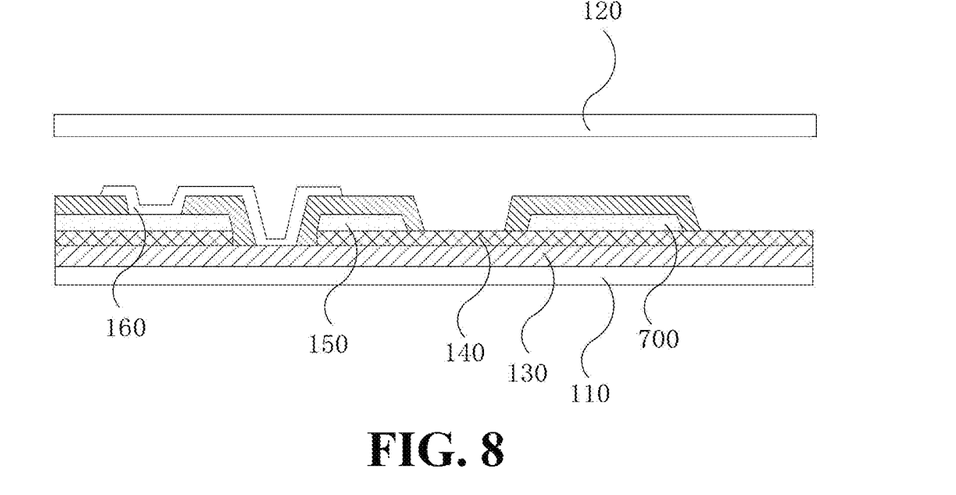
FIG. 8 is a cross-sectional view of AA' in FIG. 3.

In one or more embodiments, the display panel 100 includes: a first metal layer 130 a second metal layer 150 and an insulating layer 140 formed between the first metal layer 130 and the second metal layer 150; the conducting wire 610 is electrically connected at the notch 620 through an arranged jumper wire 800; the conducting wire 610 is formed by the second metal layer 150; the jumper wire 800 is formed by the first metal layer 130; and the jumper wire 800 and the conducting wire 610 are both provided with contact holes 810, and the jumper wire 800 and the conducting wire 610 are electrically connected through the contact holes 610.

In this solution, the signal line 700 penetrates through the notch 620 of the conducting wire to be connected to the display region 200, and the conducting wire 610 is electrically connected through the jumper wire 800 at the notch 620, such that the interference between the signal line 700 and the conducting wire 610 is avoided, the signal transmission of the signal line 700 is more stable and the transmission of the reference voltage between the conducting wires 610 is ensured; the conducting wire 610 is formed by the second metal layer 150; the jumper wire 800 is formed by the first metal layer 150; the electrical connection between the jumper wire 800 and the conducting wire 610 is realized by adopting the contact holes 810, the interference among the jumper wire 800, the conducting wire 610 and the signal line 700 is avoided, and the conducting wire 610 at the notch 620 can stably transmit the reference voltage while being communicated.

Figure 9:
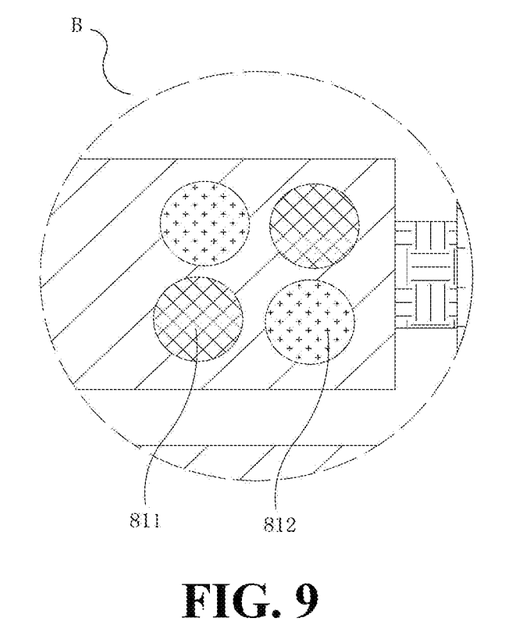
FIG. 9 is an enlarged view of position B in FIG. 7.

In one or more embodiments, the signal line 700 is formed by the second metal layer 150, and the conducting wire 610 and the signal line 700 are insulated from each other; the second metal layer 150 is provided with a conductive layer 160 insulated from the second metal layer 150; the conducting wire 610 is separated into a first conducting wire segment 630 and a second conducting wire segment 640 by the notch 620; the contact hole 810 includes a first transition hole 811 and a second transition hole 812, and the first transition hole 811 is arranged in the conducting wire 610 and is located at one ends at which the first conducting wire segment 630 and the second conducting wire segment 640 are communicated with each other; the second transition hole 812 is arranged in the jumper wire 800; and the conductive layer 160 electrically connects the first conducting wire segment 630 and the second conducting wire segment 640 with the jumper wire 800 through the first transition hole 811 and the second transition hole 812.

In this solution, the signal line 700 is formed by the second metal layer 150. That is, the conducting wire 610 and the signal line 700 are both formed by the second metal layer 150, such that the thickness of the display panel 100 is reduced and the display panel 100 is light and thin; the conducting wire 610 and the signal line 700 are formed in the same manufacturing process, such that the production efficiency is improved, the manufacturing process of the display panel 100 is reduced, and the production plan of the display panel 100 is optimized; the first conducting wire segment 630 is electrically connected with the conductive layer 160 through the first transition hole 811, the jumper wire 800 is electrically connected with the conductive layer 160 through the second transition hole 812, and the first conducting wire segment 630 is electrically connected with the jumper wire 800 through the conductive layer 160; the second conducting wire segment 640 is electrically connected with the conductive layer 160 through the first transition hole 811, the jumper wire 800 is electrically connected with the conductive layer 160 through the second transition hole 812, and the second conducting wire segment 640 is electrically connected with the jumper wire 800 through the conductive layer 160; and the first conducting wire segment 630 is then electrically connected with the second conducting wire segment 640 through the jumper wire 800 for data transmission, and the arrangement of the conductive layer 160 makes the data transmission more stable.

In one or more embodiments, the conductive layer 160 is made of a Transparent Conductive Film (ITO). In this solution, the conductive layer 160 adopts a transparent conductive film to facilitate the passage of light. While communicating the conducting wire 610 and the jumper wire 800, it will not obstruct the light emitted by the light source in the display panel 100, the power consumption of the light source in the display panel 100 is reduced, and the quality of the display panel 100 is improved.

The embodiment of this application further provides another display panel 100, including: a first substrate 110; a second substrate 120 arranged opposite to the first substrate 110, where the first substrate 110 and the second substrate 120 are respectively provided with a display region 200 and a peripheral region 300; an alignment layer 500 arranged on the first substrate 110 and the second substrate 120 and at least formed in the display region 200; and a sealing layer 400 formed in the peripheral region 300 and connecting the first substrate 110 to the second substrate 120, where the display panel 100 is provided with a conducting wire group 600 in the peripheral region 300 and the display panel 100 includes at least one signal line 700; the conducting wire group 600 includes a first conducting wire 611, a second conducting wire 612 and a third conducting wire 613, and the distances from the first conducting wire 611, the second conducting wire 612 and the third conducting wire 613 to the sealing layer are different; the first conducting wire 611 is provided with a first notch 621, the second conducting wire 612 is provided with a second notch 622, and the third conducting wire 613 is provided with a third notch 623; in the extension direction of the conducting wire group 600, the first notch 621 and the third notch 623 are located on the same side of the second notch 622, and the first notch 621 and the third notch 623 are located on the same straight line perpendicular to the extension direction of the conducting wire group 600; the signal line 700 sequentially penetrates through the first notch 621, the second notch 622 and the third notch 623 to be connected to the display region 200; the signal line 700 includes first line segments 710 and second line segments 720, the first line segments 710 and the second line segments 720 are communicated with each other, and the portions, penetrating through the first notch 621, the second notch 622 and the third notch 623, of the signal line 700 are the first line segments 710; the portions arranged outside the notches 620 and corresponding to the positions of the notches 620 are the second line segments 720, and the second line segments 720 are arranged on one side, close to or far away from the sealing layer 400, of the notches 620; and an included angle is formed between the second line segment 720 and the first line segment 710 which are bent relative to each other.

The alignment layer 500 in the display panel 100 is formed by dropping the alignment liquid. Because the alignment liquid is droplet-like and has high fluidity, even if the conducting wire 610 can obstruct the flow of the alignment liquid, when the signal line 700 straightly penetrates through the notch 620 in the conducting wire 610 to be connected to the display region 200, the alignment liquid in the display region 200 will flow into the peripheral region 300 through the notch 620 in the conducting wire along the signal line 700 before the formation of the alignment layer 500. However, the alignment liquid flowing into the peripheral region 300 will overlap the sealing layer 400, resulting in poor contact of the sealing layer 400, causing poor connection between the first substrate 110 and the second substrate 120, and affecting the yield of the display panel 100. In this solution, an included angle is formed between the first line segment 710 and the second line segment 720 of the signal line 700 which are bent relative to each other. That is, the signal line 700 is bent and the length of the signal line 700 is prolonged, making the flow path of the alignment liquid flowing into the peripheral region 300 through the notch 620 in the conducting wire along the signal line 700 be prolonged; the bending of the signal line 700 plays a role of obstructing and buffering the flow of the alignment liquid into the peripheral region 300, and the situation of poor contact of the sealing layer 400 caused by the alignment liquid overflowing and overlapping the sealing layer 400 is effectively prevented from occurring; thus the condition of connection between the first substrate 110 and the second substrate 120 is improved, and the manufacturing process yield of the display panel 100 is improved; the first notch 621 and the third notch 623 are located on the same side of the second notch 622, and the signal line 700 sequentially penetrates through the notch 620 to be connected to the display region 200, such that the inertia of the alignment liquid flowing along the signal line 700 in the conducting wire group 600 is weakened, the flow of the alignment liquid is slowed down, and the situation of poor contact of the sealing layer 400 caused by the alignment liquid overflowing and overlapping the sealing layer 400 is effectively prevented from occurring; the first notch 621 and the third notch 623 are located on the same straight line perpendicular to the extension direction of the conducting wire group 600, such that the arrangement of the signal line 700 of the conducting wire group 600 presents regular bending and presents an axially symmetric shape, it is ensured that the signal line 700 is located as far as possible in the middle of a rectangular area after the formation of a bend, thus facilitating the use of the mask when the mask is used for the manufacturing process, the mask is repetitively used to make the signal line 700 and the conducting wire group 600, and the manufacturing process of the display panel 100 is simplified.

Figure 10:
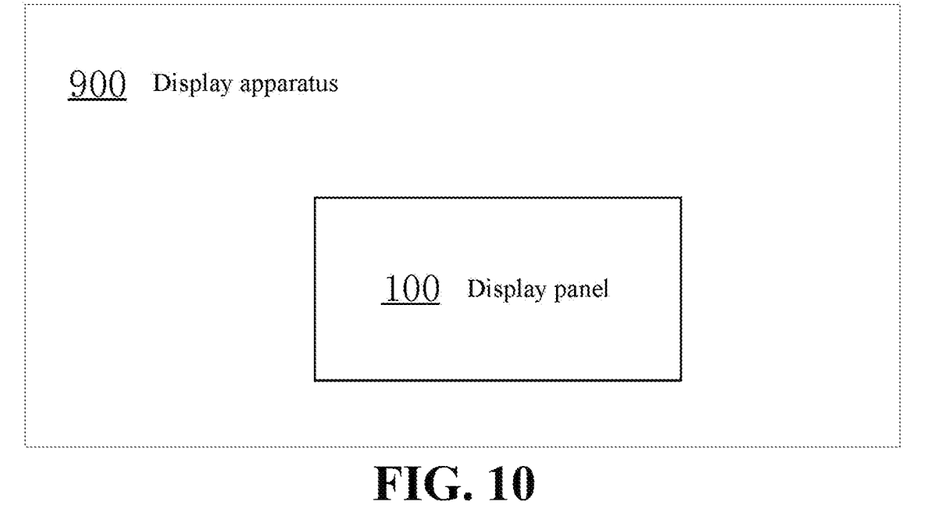
FIG. 10 is a schematic diagram of a display apparatus according to an embodiment of this application.

The embodiment of this application further provides a display apparatus 900, including the display panel 100.

The sequence of the first conducting wire 611, the second conducting wire 612, the third conducting wire 613 and the fourth conducting wire 614 mentioned above may be changed according to the actual needs, which is not limited to the sequence marked in the drawings.

The technical solution of this application can be widely used for various display panels, such as Twisted Nematic (TN) display panels, In-Plane Switching (IPS) display panels, Vertical Alignment (VA) display panels, Multi-Domain Vertical Alignment (MVA) display panels, and, of course, other types of display panels, such as Organic Light-Emitting Diode (OLED) display panels.

The foregoing contents are detailed descriptions of this application in conjunction with specific optional embodiments, and it should not be considered that the specific implementation of this application is limited to these descriptions. Persons of ordinary skill in the art can further make simple deductions or replacements without departing from the concept of this application, and such deductions or replacements should all be considered as falling within the protection scope of this application.

What is claimed is:
1. A display panel, comprising:
a first substrate;
a second substrate, arranged opposite to the first substrate, wherein
the first substrate and the second substrate are respectively provided with a display region and a peripheral region;
an alignment layer, arranged on the first substrate and the second substrate and at least formed in the display region; and
a sealing layer, formed in the peripheral region and connecting the first substrate to the second substrate,
wherein the display panel is provided with a conducting wire group in the peripheral region and the display panel comprises at least one signal line;

the conducting wire group comprises at least two conducting wires, each conducting wire comprises a notch, wherein the signal line sequentially penetrates through the corresponding notch in each conducting wire to be connected to the display region, wherein the signal line comprises a first line segment and a second line segment connected with each other, and wherein a portion of the signal line penetrating through the notch is the first line segment; wherein another portion arranged outside the notch and corresponding to the position of the notch is the second line segment, wherein the second line segment is arranged on one side of the notch adjacent to or far away from the sealing layer; and wherein an included angle less than 180 degrees is formed between the second line segment and the first line segment which are bent relative to each other;

wherein the signal line does not overlap portions of each conducting wire on both sides of the respective notch defined in this conducting wire, in a direction perpendicular to the first substrate and the second substrate; wherein each conducting wire and the signal line do not overlap the sealing layer in the direction perpendicular to the first substrate and the second substrate, and wherein each conducting wire and the signal line are arranged on an inner side of the sealing layer and are relatively closer to the display region than the sealing layer.

2. The display panel according to claim 1, wherein the included angle formed between the second line segment and the first line segment which are bent relative to each other is 90 degrees.

3. The display panel according to claim 2, wherein the conducting wire group comprises a first conducting wire and a second conducting wire, the distances from the first conducting wire and the second conducting wire to the sealing layer are different, the first conducting wire is provided with a first notch, the second conducting wire is provided with a second notch, and the first notch and the second notch are staggered from each other;

the signal line sequentially penetrates through the first notch and the second notch to be connected to the display region; the signal line comprises at least two first line segments and one second line segment, and the portions penetrating through the first notch and the second notch are the first line segments; and the portion arranged between the first notch and the second notch is the second line segment.

4. The display panel according to claim 1, wherein the conducting wire group further comprises a third conducting wire, the distance from the third conducting wire to the sealing layer is different from the distances from the first conducting wire and the second conducting wire to the sealing layer;

the third conducting wire is separately provided with a third notch at a position corresponding to the signal line, and every two of the notches are staggered from each other; and in the extension direction of the conducting wire group, the first notch is located on one side of the second notch, and the third notch is located on the other side of the second notch.

5. The display panel according to claim 3, wherein the conducting wire group further comprises a third conducting wire, the distance from the first conducting wire to the sealing layer is a first distance, the distance from the second conducting wire to the sealing layer is a second distance, and the distance from the third conducting wire to the sealing layer is a third distance; every two of the first distance, the second distance and the third distance are different;

the third conducting wire is separately provided with a third notch at a position corresponding to the signal line, and every two of the notches are staggered from each other; and in the extension direction of the conducting wire group, the first notch and the third notch are located on the same side of the second notch.

6. The display panel according to claim 5, wherein the first notch and the third notch are located on the same straight line perpendicular to the extension direction of the conducting wire group.

7. The display panel according to claim 6, wherein the signal line penetrates through the conducting wire group and the signal line is axially symmetric by taking the second conducting wire as an axis.

8. The display panel according to claim 3, wherein the conducting wire group further comprises a fourth conducting wire, the fourth conducting wire is arranged between the first conducting wire and the second conducting wire, the fourth conducting wire is provided with a fourth notch, and the fourth notch and the first notch are located on the same straight line perpendicular to the extension direction of the conducting wire group.

9. The display panel according to claim 3, wherein the conducting wire group further comprises a fourth conducting wire, the fourth conducting wire is provided with a notch, and in the extension direction of the conducting wire group, the notches extend along the same direction.

10. The display panel according to claim 3, wherein the conducting wire group further comprises a fourth conducting wire, the fourth conducting wire is provided with a notch, and in the extension direction of the conducting wire group, the notches extend along different directions.

11. The display panel according to claim 1, wherein the wire width of the conducting wire is w and the width of the position of the conducting wire corresponding to the second line segment of the signal line is smaller than w.

12. The display panel according to claim 1, wherein the display panel comprises:

a first metal layer, a second metal layer and an insulating layer formed between the first metal layer and the second metal layer;

the conducting wire is electrically connected at the notch through an arranged jumper wire;

the conducting wire is formed by the second metal layer; the jumper wire is formed by the first metal layer; and the jumper wire and the conducting wire are both provided with contact holes, and the jumper wire and the conducting wire are electrically connected through the contact holes.

13. The display panel according to claim 12, wherein the signal line is formed by the second metal layer, and the conducting wire and the signal line are insulated from each other;

the second metal layer is provided with a conductive layer insulated from the second metal layer;

the conducting wire is separated into a first conducting wire segment and a second conducting wire segment by the notch;

the contact hole comprises a first transition hole and a second transition hole, and the first transition hole is arranged in the conducting wire and is located at one ends at which the first conducting wire segment and the second conducting wire segment are connected with each other;

the second transition hole is arranged in the jumper wire; and the conductive layer electrically connects the first conducting wire segment and the second conducting wire segment to the jumper wire through the first transition hole and the second transition hole.

14. The display panel according to claim 13, wherein the conductive layer is a transparent conductive film.

15. A display panel, comprising:
a first substrate;
a second substrate, arranged opposite to the first substrate, wherein
the first substrate and the second substrate are respectively provided with a display region and a peripheral region;
an alignment layer, arranged on the first substrate and the second substrate and at least formed in the display region; and
a sealing layer, formed in the peripheral region and connecting the first substrate to the second substrate,
wherein the display panel is provided with a conducting wire group in the peripheral region and the display panel comprises at least one signal line;
the conducting wire group comprises a first conducting wire, a second conducting wire and a third conducting wire; the distances from the first conducting wire, the second conducting wire and the third conducting wire to the sealing layer are different from each other;
the first conducting wire is provided with a first notch, the second conducting wire is provided with a second notch, and the third conducting wire is provided with a third notch;
in an extension direction of the conducting wire group, the first notch and the third notch are located on a same side of the second notch, and the first notch and the third notch are located on a same straight line perpendicular to the extension direction of the conducting wire group;
the signal line sequentially penetrates through the first notch, the second notch and the third notch to be connected to the display region;
the signal line comprises first line segments and second line segments, the first line segments and the second line segment are connected with each other, and the portions of the signal line penetrating through the first notch, the second notch and the third notch are the first line segments; the portions arranged outside the notches and corresponding to the positions of the notches are the second line segments, and the second line segments are arranged on one side of the notches adjacent to or far away from the sealing layer; and wherein an included angle less than 180 degrees is formed between the second line segment and the first line segment which are bent relative to each other;
wherein the signal line does not overlap portions of each conducting wire on both sides of the respective notch defined in this conducting wire, in a direction perpendicular to the first substrate and the second substrate; wherein each conducting wire and the signal line do not overlap the sealing layer in the direction perpendicular to the first substrate and the second substrate, and wherein each conducting wire and the signal line are arranged on an inner side of the sealing layer and are relatively closer to the display region than the sealing layer.

16. A display apparatus, comprising a display panel, wherein the display panel comprises:
a first substrate;
a second substrate, arranged opposite to the first substrate, wherein
the first substrate and the second substrate are respectively provided with a display region and a peripheral region;
an alignment layer arranged on the first substrate and the second substrate and at least formed in the display region; and
a sealing layer formed in the peripheral region and connecting the first substrate to the second substrate,
wherein the display panel is provided with a conducting wire group in the peripheral region and the display panel comprises at least one signal line;
the conducting wire group comprises at least two conducting wires, each conducting wire comprises a notch, wherein the signal line sequentially penetrates through the corresponding notch in each conducting wire to be connected to the display region, wherein the signal line comprises a first line segment and a second line segment connected with each other, and wherein a portion of the signal line penetrating through the notch is the first line segment; wherein another portion arranged outside the notch and corresponding to the position of the notch is the second line segment, wherein the second line segment is arranged on one side of the notch adjacent to or far away from the sealing layer; and wherein an included angle less than 180 degrees is formed between the second line segment and the first line segment which are bent relative to each other;
wherein the signal line does not overlap portions of each conducting wire on both sides of the respective notch defined in this conducting wire, in a direction perpendicular to the first substrate and the second substrate; wherein each conducting wire and the signal line do not overlap the sealing layer in the direction perpendicular to the first substrate and the second substrate, and wherein each conducting wire and the signal line are arranged on an inner side of the sealing layer and are relatively closer to the display region than the sealing layer.

17. The display apparatus according to claim 16, wherein the conducting wire group comprises a first conducting wire, a second conducting wire and a third conducting wire, the distances from the first conducting wire, the second conducting wire and the third conducting wire to the sealing layer are different from each other, the first conducting wire is provided with a first notch, the second conducting wire is provided with a second notch, the third conducting wire is separately provided with a third notch at a position corresponding the signal line, and every two of the notches are staggered from each other;
the signal line sequentially penetrates through the first notch and the second notch to be connected to the display region; the signal line comprises at least two first line segments and one second line segment, and the portions penetrating through the first notch and the second notch are the first line segments; the portion arranged between the first notch and the second notch is the second line segment; the conducting wire group further comprises a third conducting wire, and the distance from the third conducting wire to the sealing layer is different from the distances from the first conducting wire and the second conducting wire to the sealing layer; and
in the extension direction of the conducting wire group, the first notch is located on one side of the second notch, and the third notch is located on the other side of the second notch.

* * * * *